US 9,845,532 B2

(12) United States Patent
Van Ommen

(10) Patent No.: US 9,845,532 B2
(45) Date of Patent: Dec. 19, 2017

(54) APPARATUS AND PROCESS FOR ATOMIC OR MOLECULAR LAYER DEPOSITION ONTO PARTICLES DURING PNEUMATIC TRANSPORT

(75) Inventor: Jan Rudolf Van Ommen, Delft (NL)

(73) Assignee: Delft University of Technology, Delft (NL)

( * ) Notice: Subject to any disclaimer, the term of this patent is extended or adjusted under 35 U.S.C. 154(b) by 1088 days.

(21) Appl. No.: 13/254,854

(22) PCT Filed: Mar. 4, 2010

(86) PCT No.: PCT/EP2010/052769
§ 371 (c)(1),
(2), (4) Date: Sep. 5, 2011

(87) PCT Pub. No.: WO2010/100235
PCT Pub. Date: Sep. 10, 2010

(65) Prior Publication Data
US 2012/0009343 A1    Jan. 12, 2012

(30) Foreign Application Priority Data
Mar. 4, 2009    (NL) ...................................... 2002590

(51) Int. Cl.
*C23C 16/44*    (2006.01)
*C23C 16/455*    (2006.01)

(52) U.S. Cl.
CPC .... *C23C 16/4417* (2013.01); *C23C 16/45525* (2013.01); *C23C 16/45551* (2013.01)

(58) Field of Classification Search
CPC ............ C23C 16/45525; C23C 16/442; C23C 16/45551; B05D 2252/02; B05D 7/00
(Continued)

(56) References Cited

U.S. PATENT DOCUMENTS

| 4,991,541 A | 2/1991 | Sugata et al. |
| 5,227,195 A | 7/1993 | Sanjurjo |

(Continued)

FOREIGN PATENT DOCUMENTS

| GB | 2214195 A | 8/1989 |
| WO | 03008186 A1 | 1/2003 |

OTHER PUBLICATIONS

Fotou et al. "Sequential Gas-Phase Formation of Al2O3 and SiO2 Layers on Aerosol-Made TiO2 Particles", Advanced Materials, vol. 9, No. 5, 1997 pp. 420-423.*

(Continued)

*Primary Examiner* — Tabatha Penny
(74) *Attorney, Agent, or Firm* — Foley & Lardner LLP

(57) ABSTRACT

The invention provides a process for depositing a coating onto particles being pneumatically transported in a tube. The process comprising the steps of providing a tube having an inlet opening and an outlet opening; feeding a carrier gas entraining particles into the tube at or near the inlet opening of the tube to create a particle flow through the tube; and injecting a first self-terminating reactant into the tube via at least one injection point downstream from the inlet opening of the tube for reaction with the particles in the particle flow. The process is suitable for atomic layer deposition and molecular layer deposition. An apparatus for carrying out the process is also disclosed.

20 Claims, 1 Drawing Sheet

(58) Field of Classification Search
USPC .............. 427/213, 212, 248.1; 118/716
See application file for complete search history.

(56) References Cited

U.S. PATENT DOCUMENTS

| | | | |
|---|---|---|---|
| 6,713,177 B2 * | 3/2004 | George et al. | 428/402 |
| 2006/0062902 A1 | 3/2006 | Sager et al. | |
| 2007/0280895 A1 * | 12/2007 | Weimer | A61K 8/11 424/59 |
| 2008/0166884 A1 * | 7/2008 | Nelson et al. | 438/765 |

OTHER PUBLICATIONS

Fotou et al., "Sequencial Gas-Phase Formation of Al2O3 and SiO2 Layers on Aersol-Made TiO2 Particles", Advanced Materials, 1997, vol. 9, No. 5, pp. 420-423.*

Fotou, Coating Titania Aerosol Particles with ZrO2, Al2O3/ZrO2 and SiO2/ZrO2 in a Gas-Phase Process, Aerosol Science and Technology, 33:6, 557-571.*

R. Puurunen. "Surface Chemistry of Atomic Layer Deposition: A Case Study for the Trimethylaluminum / Water Process", Journal of applied physics 97, 121301 (2005).

Helmsing et al. "Short Contact Time Experiments in a Novel Benchscale FCC Riser Reactor", Chemical Engineering Science, vol. 51, No. 11, pp. 3039-3044 (1996).

Zaitsu, S. "Laser Damage Properties of Optical Coatings With Nanoscale Layers Grown by Atomic Layer Deposition", Jpn.J.Appl. Phys, part 1, vol. 43, No. 3, pp. 1034-1035 (2004).

Marakulin Yu et al. "Optimisation of the Operating Conditions of Pneumatic Transport Systems for Loose Materials", Refractories, vol. 32, No. 7/8, p. 365-366, (1991).

King D. M. et al. "Atomic Layer Deposition on Particles Using a Fluidized Bed Reactor With in Situ Mass Spectrometry", Surface and Coatings Technology, vol. 201, Aug. 9, 2007, pp. 9163-9171.

Den Hollander, M. A. et al. "Coke Formation in fluid catalytic cracking studied with the microriser", Catalysis Today, vol. 46, No. 1, Nov. 2, 1998, pp. 27-35.

Vahlas, Constantin et al. "Principles and applications of CVD powder technology", Materials Science and Engineering R:, Reports, Elsevier Sequoia S.A., Lausanne, vol. 53, No. 1-2, Jul. 30, 2006, pp. 1-72.

Fotou, G. P. et al. "Sequential Gas-Phase Formation of Al2O3 an SiO2 Layers on Aerosol-Made TiO2 Particles", Advanced Materials, Wiley VCH Verlag, DE, vol. 9, No. 5, Apr. 1, 1997, pp. 420-423.

* cited by examiner

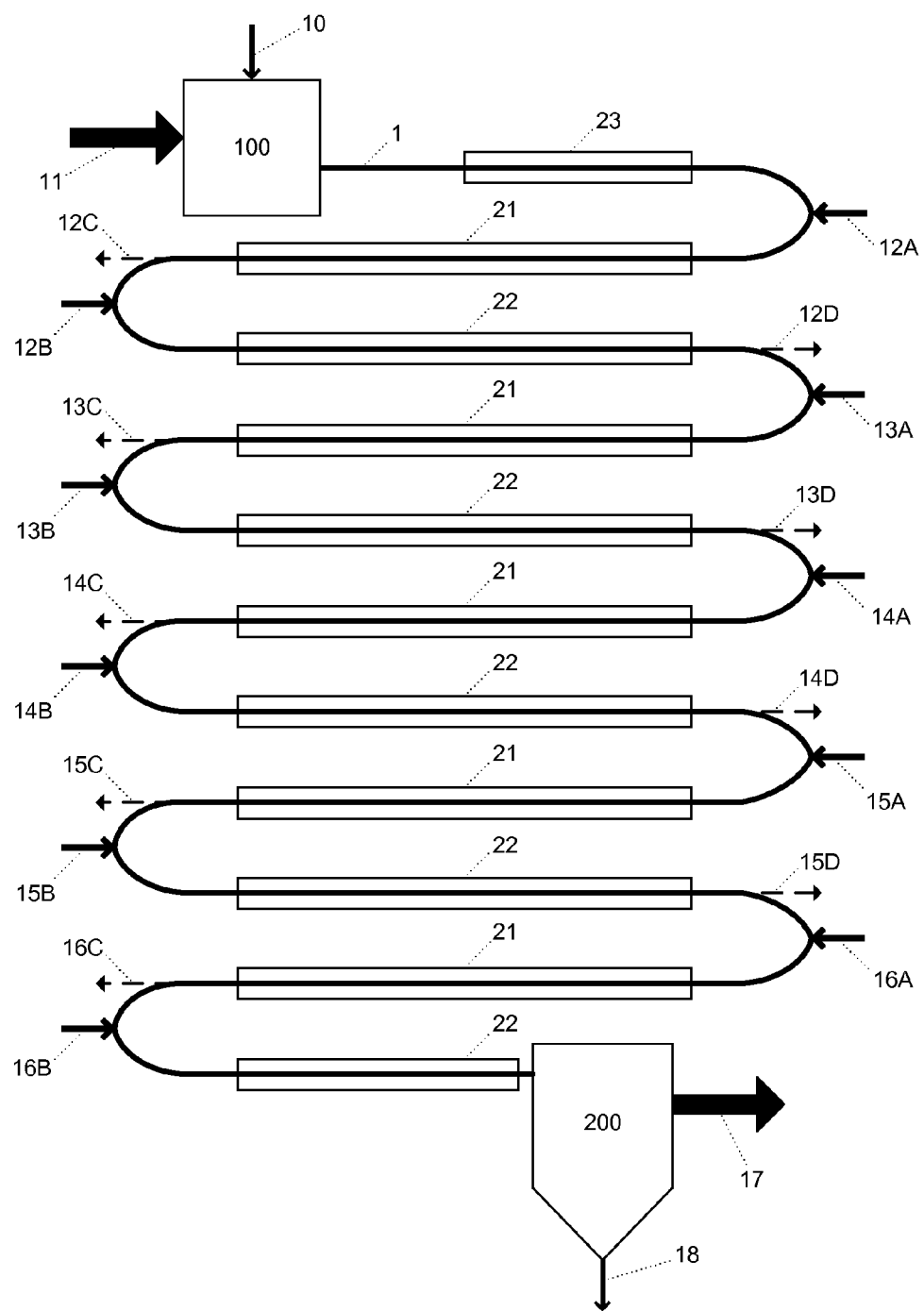

APPARATUS AND PROCESS FOR ATOMIC OR MOLECULAR LAYER DEPOSITION ONTO PARTICLES DURING PNEUMATIC TRANSPORT

BACKGROUND OF THE INVENTION

1. Field of the Invention

The invention relates generally to a continuous process for depositing layers onto small particles, and more particularly to a continuous process for atomic or molecular layer deposition onto small particles, in particular nanoparticles.

2. Description of the Related Art

Several techniques are known for depositing layers of a material onto a solid substrate. Examples include electroplating; electroless plating; chemical vapor deposition; and atomic or molecular layer deposition. The various techniques are essentially carried out in batch mode, and the deposition process may have to be repeated several times in order to obtain a coating of a specific desired thickness. As a result, the state of the art processes tend to be cumbersome and expensive.

GB 2 214 195 A discloses a pneumatic transport reactor for coating particles with a metal, for example Ni, Fe or Co, by decomposing the gaseous carbonyl of the metal thermally on the heated surface of the particles. The apparatus is constructed in the form of a loop, comprising a downwardly extending section and an upwardly extending section. The particles are mixed with a carrier gas containing the metal carbonyl in the downward section. The carbonyl is decomposed in the upward section, depositing metal on the particle. The apparatus comprises a separator, such as a cyclone, for separating the particles from the carrier gas.

The apparatus is suitable for particles having a particle size in the lower micron range, on the order of 4 μm. The particles may be circulated through the closed loop until the desired coating thickness is achieved, in what is essentially a batch-wise operation.

Puurunen, "*Surface chemistry of atomic layer deposition: A case study for the trimethylaluminum/water process*" Journal of Applied Physics 97, 121301 (2005) provides an overview of atomic layer deposition techniques in general, and of alumina in particular. In essence, atomic layer deposition ("ALD") is a specific form of chemical vapor deposition, based on self-terminating gas-solid reactions.

The growth of layers by ALD consists of repeating reaction cycles consisting of four steps:
(1) A self-terminating reaction of a first reactant (Reactant A) with the surface of a solid substrate;
(2) A purge or evacuation to remove non-reacted Reactant A and any gaseous reaction by-products;
(3) A self-terminating reaction of a second reactant (Reactant B), or another treatment to activate the surface of the substrate again for a reaction with Reactant A.
(4) A purge or evacuation of excess Reactant B and of gaseous reaction products produced in step (3).

Step (1) is self-terminating in the sense that it stops when a monolayer is formed. A monolayer, in the context of ALD, is formed when all chemisorption sites available for Reactant A at the surface of the substrate are occupied. An important advantage of ALD is that layers are deposited epitaxially, resulting in a coating that is well defined down to an atomic scale. However, with ALD, by definition, only one atomic layer is deposited in each reaction cycle. For the formation of a relatively thick coating ALD may thus be less suitable, as the deposition of such coating may require tens, sometimes hundreds or even thousands of reaction cycles.

US Published Patent Application 2006/0062902 A1 discloses use of ALD for producing CIGS particles for use in photovoltaic panels. The particles are agitated to form a fluidized bed during coating, so that all the surface area of the suspended particle is accessible for surface reactions.

Helmsing et al., "*Short Contact Time Experiments in a Novel Benchscale FCC Riser Reactor*", Chemical Engineering Science, Vol. 51, No. 11, pp 3039-3044 (1996) disclose an entrained flow reactor consisting essentially of a long, thin tube. The tube is looped so as to fit in a heating chamber of a manageable size. The reactor can be operated under plug flow conditions, making it suitable for testing catalysts used in fluid catalytic cracking ("FCC") of crude oil fractions. The reactor has a single injection point for reactants.

Thus, there is a particular need for a continuous process for depositing atomic or molecular layers onto small particles, and for an apparatus for carrying out such a continuous process.

BRIEF SUMMARY OF THE INVENTION

The present invention addresses these problems by providing a process for depositing sequential layers onto particles being pneumatically transported in a tube, the process comprising the steps of (i) providing a tube having an inlet opening and an outlet opening; (ii) feeding a carrier gas entraining particles into the tube at or near the inlet opening of the tube to create a particle flow through the tube; injecting a first self-terminating reactant into the tube via at least one injection point downstream from the inlet opening of the tube for reaction with the particles in the particle flow. The injection of reactant into a particle flow in a tube for reaction with these particles enable a continuous process of layer deposition on particles.

Another aspect of the invention comprises an apparatus for depositing sequential layers onto particles while the particles are subjected to pneumatic transport, the apparatus comprising (i) a tube having an inlet opening and an outlet opening; (ii) a feeder device for feeding a carrier gas entraining the particles into the tube; and (iii) at least one injection point downstream from the inlet opening for introducing a reactant into the tube, wherein the apparatus is arranged to perform abovementioned process.

BRIEF DESCRIPTION OF THE DRAWING

The features and advantages of the invention will be appreciated upon reference to the following drawing, in which:

FIG. 1 is a schematic view of an embodiment of the apparatus of the invention.

DETAILED DESCRIPTION OF THE INVENTION

The invention relates to a continuous process or method for depositing sequential layers onto particles being pneumatically transported in a tube, said process comprising the steps of (i) providing a tube having an inlet opening and an outlet opening; (ii) feeding a carrier gas entraining particles into the tube at or near the inlet opening of the tube; injecting a reactant into the tube via at least one injection point downstream from the inlet opening of the tube.

The process is suitable for depositing layers by an atomic layer deposition process and/or a molecular layer deposition process. The particles may include agglomerates formed by smaller particles. Such agglomerates allow for pneumatic transport of very small particles, while the surface of these very small particles remain available for reaction with the reactant. Throughout the description, the term "particles" may refer to both particles and agglomerates formed by these particles.

In a preferred embodiment of the process, the particles travel through the tube in substantially a plug flow. Although the term "plug flow" may suggest that the particles travel at the same linear velocity as the carrier gas, for larger particles this is not the case. With particles larger than several micrometers there is a certain amount of slippage between the carrier gas and the entrained particles, such that the carrier gas travels at a greater velocity than do the particles. Under those circumstances, due to this slippage, the reactor is essentially self-purging: unreacted reactants and reaction products are removed from the particles by carrier gas overtaking and passing the particles.

This self-purging aspect of the process of the invention contributes to the ability of the process to be operated in a continuous mode, which makes the process attractive for conducting atomic or molecular layer deposition reaction cycles. As, in general, it is desirable to deposit more than one layer onto the particles, a preferred embodiment of the process uses a plurality of injection points downstream of the inlet opening of the tube.

This self-purging effect is not present when the particle size is too small for any significant slippage to take place. The process of the invention can be used even under these circumstances for depositing a small number of layers. For example, when preparing catalyst particles it is oftentimes sufficient to deposit only one layer.

Even for depositing a larger number of layers onto small particles the process of the invention is useful. For this embodiment of the process it may be desirable to provide the tube with purge ports for removing reaction by-products and unreacted reactants.

In traditional chemical vapor deposition each reactant injection point corresponds to the deposition of a layer onto the particle. This layer is not necessarily a monolayer. For example, the process may be used for depositing a metal, such as Ni, Fe, or Co, whereby a corresponding organometallic compound is injected into the first reactant injection point. The tube may be kept at a temperature sufficiently high to cause decomposition of the organometallic compound. In general, temperatures in the range of 100 to 320° C. are suitable, the lower limit being governed by the decomposition temperature of the organometallic compound. Alternatively, a plasma could be used to activate the reaction.

Upon entering the tube the organometallic compound decomposes, and the metal is deposited onto the particles entrained by the carrier gas. The organic compound produced in the decomposition reaction of the organometallic compound is removed from the particles by the carrier gas. The deposition cycle is repeated upon injection of organometallic compound at the second injection point, whereby a second layer of metal is deposited onto the particle. In general, when the process is used in traditional chemical vapor deposition, the number of layers deposited onto the particles is identical the number of injection points receiving organometallic compound.

The term "traditional chemical vapor deposition" as used herein generally refers to single-reactant chemical vapor deposition or multiple reactants added at the same time, in which the reaction is not self-terminating. Atomic Layer Deposition ("ALD") can be considered a specific embodiment of chemical vapor deposition. In ALD, only one atomic layer is deposited in each reaction cycle. In particular, the term "Atomic Layer Deposition" or "ALD", as used herein, refers to a chemical vapor deposition process in which a reactant is deposited onto the surface of the particles in a self-terminating reaction. In many cases the process cycle comprises a second reaction step, in which a second reactant is contacted with the particle surface. The term ALD as used herein is, however, not limited to this dual reactant process, as other means may be used to activate the surface of the particle for a subsequent reaction with the first reactant.

Importantly, depending on the specific reactants, the "atomic" layer being deposited may in fact be a molecular layer. The term ALD as used herein encompasses also molecular layer deposition.

The ALD process will be explained with reference to a dual reactant ALD reaction cycle. The first reactant is injected into the first injection point. This first reactant is a precursor of the atom or molecule to be deposited onto the surface of the particles. The first reactant interacts with the particles to form a chemisorption monolayer onto the surface of the particles. If gas/particle slippage occurs, unreacted first reactant and reaction by-products are removed from the particles by the self-purging mechanism described above.

The second reactant is injected into the second injection point. Upon entering the tube, the second reactant comes into contact with the particles, which are covered with a monolayer of (a reaction product of) the first reactant. The second reactant reacts with the chemisorbed (reaction product of) the first reactant to form the atom or molecule layer of the desired coating material. If gas/particle slippage occurs, unreacted second reactant and reaction by-products are removed from the particles by the self-purging mechanism.

A second ALD layer may be deposited by injecting the first reactant into a third injection point, and the second reactant into a fourth reaction point, and so on. In general, a large number of layers can be deposited by providing a large number of injection points along the tube. The first reactant is injected into injection points 1, 3, 5, etc. (counting from the inlet opening and going downstream); the second reactant is injected into injection points 2, 4, 6, etc. In general, the first reactant is injected into the odd-numbered injection points, and the second reactant is injected into the even-numbered injection points.

The self-purging mechanism described above is an idealized model, which is generally met only in tubes having a single injection point. Particles located at a second injection point are purged by a carrier gas comprising small quantities of unreacted reactant and/or reaction by-products from the first reaction point. In general these contaminants are sufficiently diluted not to cause problems. In particular if the tube contains a large number of injection points, it may be desirable to provide one or more flush points for removing reaction products and/or unreacted reactants.

Desirably, the carrier gas is an inert gas, for example nitrogen or a noble gas, in particular helium.

The linear velocity of the carrier gas is selected to be high enough to cause entertainment of the particles. Accordingly, the lower limit of this linear velocity is largely determined by factors such as the mean particle size, the particle density, and the aspect ratio of the particles. It will be understood that the particle size increases as the particles travel through the tube, as a result of the coating layers being deposited onto the particles. The linear velocity of the carrier gas should be sufficient for entraining the particles after deposition of the desired number of coating layers. For this purpose, the linear velocity may be increased along the tube. In some embodiments such velocity increase is at least partially obtained by the subsequent reactant injections.

In an alternate embodiment of the process the tube is provided with one or more flush points, which are used not only to flush the carrier gas, but also to increase the carrier gas flow rate by introducing more carrier gas than is being flushed out. As a result the linear velocity of the carrier gas is increased downstream from the flush point, to compensate for the increase in weight and size of the particles.

The upper limit of the linear velocity of the carrier gas is determined primarily be the desire to operate the tube under plug flow conditions. The principles of plug flow are well known to those skilled in the art. The conditions for plug flow for a tube similar to the one used in the process of the invention are disclosed in Helmsing et al., "*Short Contact Time Experiments in a Novel Benchscale FCC Riser Reactor*", Chemical Engineering Science, Vol. 51, No. 11, pp 3039-3044 (1996), the disclosures of which are incorporated herein by reference.

The linear velocity is preferably chosen so as to obtain completion of the self-terminating reaction before the next injection point is encountered. In general, the linear velocity of the carrier gas is in the range of from 0.02 to 30 m/s, preferably in the range of from 0.1 to 10 m/s.

The tube is kept at a temperature suitable for the reaction cycles being carried out within the tube. In general, the temperature is in the range of from 0 to 1000° C. In ALD the first and second reactions of a reaction cycle may require different reaction temperatures. In a preferred embodiment of the invention different parts of the tube may be kept at different temperatures. Specifically, tube segments downstream from odd-numbered injection points and upstream to even-numbered injection points are kept at a first temperature, corresponding to the reaction temperature of the first reaction of the ALD reaction cycle. Likewise, tube segments from even numbered injection points to odd numbered injection points are kept at a second temperature, corresponding to the reaction temperature of the second reaction of the ALD reaction cycle.

Optionally, before reaching an injection point, particles in the tube may be pre-conditioned. Particle pre-conditioning can be particularly useful before particles are brought into contact with the first reactant, i.e. upstream the first injection point. Pre-conditioning may include heating of the particles upstream an injection point to a desired temperature, preferably a temperature corresponding or close to the reaction temperature of the reaction planned downstream the injection point. Pre-heating of particles upstream the injection point may limit development of a temperature gradient in the tube downstream of the injection point. The presence of such temperature gradient is undesirable as it may induce different reaction rates in different portions of the tube. A substantially constant temperature at different portions of the tube provides a more constant reaction rate, which simplifies reaction control and apparatus design.

Additionally, or alternatively, reactants injected in the tube may also be pre-heated to a suitable temperature before they are injected into the tube for similar reasons as discussed above with respect to the pre-heating of the particles.

Tube segments from even-numbered injection points to odd-numbered injection points may be made of a different material than tube segments from odd-numbered injection points to even-numbered injection points to accommodate reactions at different temperatures and/or cope with different reactants and/or gaseous reactant products. For example, some tube segments may be made of Teflon, while others may be made of stainless steel. The selection of a suitable tube material may be based on finding an optimum in chemical resistance and heat conduction properties. For example, if keeping a constant temperature throughout the tube is of importance, a tube material with a sufficiently high heat conduction coefficient is desirable. Additionally, it may be desirable that the reaction between particles and injected reactants is not disturbed by chemical reactions with binding groups in the tube walls. Therefore, if such reactions are likely to occur due to the use of a specific type of reactants, a material with sufficient resistance against such chemical reactions is desirable.

The process is suitable for depositing coatings onto particles of a broad range of mean particle sizes, from about 2 nm to 1 mm. An important advantage of the process of the invention, as compared to fluidized bed processes of the prior art, is its ability to coat particles having a particle size well below 1 mm.

Another aspect of the present invention is an apparatus for carrying out the above-described process. In its broadest aspect this aspect relates to an apparatus for a continuous process for atomic layer deposition onto particles while said particles are subjected to pneumatic transport, said apparatus comprising (i) a tube having an inlet opening and an outlet opening; (ii) a feeder device for feeding a carrier gas entraining the particles into the tube; and (iii) at least one injection point downstream from the inlet opening for introducing a reactant into the tube.

In a preferred embodiment the tube has a plurality of injection points downstream from the inlet opening. Desirably the injection points are spaced apart along at least a portion of the length of the tube. Preferably the injection points are spaced along substantially the length of the tube.

A preferred embodiment of the apparatus comprises at least one flush point for removing reaction by-products from the tube. The term "reaction by-products" in this context includes unreacted reactants.

The tube has an internal diameter in the range of from 0.02 to 300 mm. The actual diameter may be selected within this range in function of the mean diameter of the particles to be coated within the apparatus, the desired linear velocity of the carrier gas, and like such factors. In most cases a suitable tube inner diameter is in the range of from 0.1 mm to 100 mm, preferably in the range of from 1 mm to 20 mm.

If there is more than 1 injection point, the distance between to adjoining injection points is preferably determined by the time required for the reaction to self-terminate, and the distance traveled by the carrier gas during that time. The reactions involved are generally more or less instantaneous, but some time needs to be allowed for the reactants to travel from the injection point to the particles. In general, subsequent injection points are from 10 mm to 5000 mm apart, preferably from 10 mm to 100 mm apart.

The length of the tube is determined primarily by the number of injection points required. Accordingly, the length of the tube is in the range of from 0.1 m to 500 m. In many cases the length of the tube is in the range of from 5 m to 50 m.

In order to limit the physical space requirements of the apparatus the tube may be folded or coiled. Suitably, the tube is contained in a chamber provided with means for heating and/or cooling. The actual design of the chamber, and the specifications of the heating and/or cooling means, may be based on the desired operating temperature. The operating temperature may be in the range of from 0° C. to 1000° C.

FIG. 1 is a schematic representation of an embodiment of the apparatus of the invention for deposing a number of layers onto particles entrained in a flow of gas. Particles 10 are fed into fluidizer 100 where they are fluidized by inert gas 11, e.g. nitrogen, and entrained into a coiled tube 1. At first injection point 12A the first reactant of an atomic layer deposition cycle is introduced into the coiled tube. At second injection point 12B the second reactant of the ALD cycle is introduced into the coiled tube. At injection point 13A a second dose of the first reactant is introduced, and at injection point 13B the coiled tube receives a second dose of the second reactant. The cycle is repeated at injection point pairs 14A/14B; 15A/15B; and 16A/16B. A separation device 200 separates the coated particles 18 from the gas flow 17, which may now not only comprise the inert gas, but also gaseous reaction products, and unreacted reactants. The separation device 200 may be any suitable separation device, for example a cyclone separator.

Optionally, as denoted by the dashed arrows, one or more flush points 12-16C, 12-16D are arranged along the tube to remove gaseous reaction products from the gas flow. In particular, flush points 12C, 13C, 14C, 15C and 16C may predominantly remove gaseous reaction products related to the first reactant. Similarly, flush points 12D, 13D, 14D, 15D, and 16D may predominantly remove gaseous reaction products related to the second reactant. The flush points may comprise a suitable filter to allow reaction products to be removed while keeping particles in the tube 1.

Optionally, the temperature of the different reactions may be set by temperature control units 21, 22, for example heat exchangers or other types of devices for heating and/or cooling known to a person skilled in the art. The temperature control units 21 may be arranged to control the temperature in parts of the tube reserved for reaction with the first reactant, i.e. downstream injection points of the first reactant and upstream injection points of the second reactant. For example, the temperature control units 21 may be arranged to keep the temperature in these tube parts at a first temperature. Similarly, the temperature control units 22 may be arranged to control the temperature in tube parts reserved for reaction with the second reactant, e.g. by keeping the temperature in these parts at a second temperature.

Optionally, a pre-conditioning unit 23 is arranged for pre-conditioning the particles in the particle flow. Such pre-conditioning may include heating particles to a temperature close to a desirable reaction temperature with the first reactant provided via injection point 12A. Although not explicitly shown, more pre-conditioning units may be used in the apparatus, for example to pre-heat particles upstream further injection points.

It will be understood that the representation is a schematic one. The depicted number of injection point pairs (numbering 5 in FIG. 1) represents a plurality of injection point pairs which, in reality, may range from just 1 to several hundreds or even thousands.

What is claimed is:

1. A process for depositing a coating onto particles being pneumatically transported in a tube, said process comprising the steps of:
    (i) providing a tube having an inlet opening and an outlet opening;
    (ii) feeding a carrier gas entraining particles into the tube at or near the inlet opening of the tube to create a particle flow through the tube;
    (iii) injecting a first reactant into the tube via an injection point downstream from the inlet opening of the tube for deposition on the surface of the particles in the particle flow in a self-terminating reaction;
    (iv) injecting a second reactant into the tube via a further injection point downstream from the injection point of the first reactant for deposition on the surface of the particles in the particle flow in a self-terminating reaction;
    wherein the tube is provided with a plurality of injection points numbered sequentially from the inlet opening of the tube; wherein the first reactant is injected into the odd-numbered injection points; and the second reactant is injected into the even-numbered injection points; and wherein the process further comprising:
        (a) keeping tube segments downstream from odd-numbered injection points and upstream to even-numbered injection points at a first temperature; and
        (b) keeping tube segments downstream from even-numbered injection points and upstream to odd-numbered injection points at a second temperature;
    wherein the tube comprises one or more flush points for increasing a linear velocity of the carrier gas downstream from the one or more flush points, and wherein the first temperature is different from the second temperature.

2. The process of claim 1, wherein the particles comprise agglomerates of smaller particles.

3. The process of claim 1, wherein the first reactant is injected into the tube via a plurality of injection points downstream from the inlet opening of the tube, and an injection point downstream from another injection point is arranged to increase the velocity of the carrier gas.

4. The process of claim 3, wherein the injection points are spaced along at least a portion of the length of the tube.

5. The process of claim 4, wherein the injection points are spaced along substantially the length of the tube.

6. The process of claim 1, further comprising pre-conditioning the particles in the tube upstream of an injection point.

7. The process of claim 1, wherein the first reactant is a precursor for the second reactant.

8. The process of claim 1, wherein the further injection point is arranged to increase the velocity of the carrier gas.

9. The process of claim 1, wherein the carrier gas is fed at such velocity that the carrier gas velocity is greater than the particle velocity in the particle flow.

10. The process of claim 1, wherein the particle flow takes the form of a plug flow.

11. The process of claim 1, further comprising removing reaction by-products from the tube at at least one flush point.

12. The process of claim 11, wherein reaction by-products are removed from the tube at a plurality of flush points spaced along the length of the tube.

13. The process of claim 12, wherein a plurality of flush points are also used to introduce carrier gas in the tube.

14. The process of claim 1, wherein the injection points are spaced such that a self-terminating reaction is substantially self-terminated between injection points.

15. The process of claim 1, wherein the carrier gas is an inert gas.

16. The process of claim 1, wherein the carrier gas travels through the tube at a linear velocity of from 0.02 to 30 m/s.

17. The process of claim 1, wherein the particle size of the particles being coated is in the range of from 2 nm to 1 mm.

18. The process of claim 1, wherein the tube is provided with a plurality of injection points downstream of the inlet opening of the tube, for conducting atomic layer deposition and/or molecular layer deposition reaction cycles.

19. The process of claim 1, wherein the carrier gas travels through the tube at a linear velocity of from 0.1 to 10 m/s.

20. A continuous process for depositing a coating onto particles being pneumatically transported in a tube, said process comprising an atomic layer deposition process and/or a molecular layer deposition process and comprising the steps of:
(i) providing a tube having an inlet opening and an outlet opening;
(ii) feeding a carrier gas entraining particles into the tube at or near the inlet opening of the tube to create a particle flow through the tube;
(iii) injecting a first dose of a first reactant into the tube via a first injection point downstream from the inlet opening of the tube to obtain a first chemisorption monolayer of the first reactant on the surface of the particles in the particle flow in a self-terminating reaction;
(iv) injecting a first dose of a second reactant into the tube via a second injection point downstream from the first injection point to obtain a first atomic or molecule layer by reaction of the first chemisorption monolayer and the second reactant on the surface of the particles in the particle flow in a self-terminating reaction;
(v) injecting a second dose of the first reactant into the tube via a third injection point downstream from the second injection point to obtain a second chemisorption monolayer of the first reactant on the surface of the particles coated with the first atomic or molecule layer in the particle flow in a self-terminating reaction; and
(vi) injecting a second dose of the second reactant into the tube via a fourth injection point downstream from the third injection point to obtain a second atomic or molecule layer by reaction of the second chemisorption monolayer and the second reactant on the surface of the particles in the particle flow in a self-terminating reaction;
wherein the tube is provided with a plurality of injection points numbered sequentially from the inlet opening of the tube; wherein the first reactant is injected into the odd-numbered injection points; and the second reactant is injected into the even-numbered injection points; and wherein the process further comprising:
(a) keeping tube segments downstream from odd-numbered injection points and upstream to even-numbered injection points at a first temperature; and
(b) keeping tube segments downstream from even-numbered injection points and upstream to odd-numbered injection points at a second temperature;
wherein the tube comprises one or more flush points for increasing a linear velocity of the carrier gas downstream from the one or more flush points, and wherein the first temperature is different from the second temperature.

* * * * *